United States Patent
Park et al.

(10) Patent No.: US 9,502,693 B2
(45) Date of Patent: Nov. 22, 2016

(54) METHOD OF MANUFACTURING ORGANIC LIGHT-EMITTING DISPLAY APPARATUS

(71) Applicant: Samsung Display Co., Ltd., Yongin-si, Gyeonggi-Do (KR)

(72) Inventors: Jungsun Park, Yongin (KR); Hyunsung Bang, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/808,664

(22) Filed: Jul. 24, 2015

(65) Prior Publication Data
US 2016/0197313 A1    Jul. 7, 2016

(30) Foreign Application Priority Data
Jan. 6, 2015  (KR) .......................... 10-2015-0001180

(51) Int. Cl.
H01L 51/56 (2006.01)
H01L 27/32 (2006.01)
H01L 51/52 (2006.01)

(52) U.S. Cl.
CPC ........... *H01L 51/56* (2013.01); *H01L 27/3211* (2013.01); *H01L 27/3248* (2013.01); *H01L 51/5206* (2013.01); *H01L 51/5237* (2013.01); *H01L 2227/323* (2013.01)

(58) Field of Classification Search
None
See application file for complete search history.

(56) References Cited

U.S. PATENT DOCUMENTS

| | | | |
|---|---|---|---|
| 8,043,793 B2 | 10/2011 | Iizumi et al. | |
| 8,871,545 B2 | 10/2014 | Lee et al. | |
| 9,006,009 B2 | 4/2015 | Kim et al. | |
| 2007/0190233 A1* | 8/2007 | Chung | H01L 51/0005 427/58 |
| 2008/0238297 A1* | 10/2008 | Oota | H01L 27/3211 313/500 |
| 2009/0091254 A1* | 4/2009 | Jeong | H01L 27/3272 313/504 |
| 2012/0007057 A1* | 1/2012 | Choi | H01L 27/3246 257/40 |
| 2014/0127625 A1 | 5/2014 | Defranco et al. | |
| 2014/0203245 A1* | 7/2014 | Gupta | H01L 51/5203 257/40 |
| 2014/0220715 A1* | 8/2014 | Kang | C23C 14/042 438/26 |
| 2014/0315336 A1* | 10/2014 | Yoo | H01L 51/56 438/22 |
| 2014/0332762 A1* | 11/2014 | Kim | H01L 51/5271 257/40 |
| 2014/0346449 A1* | 11/2014 | Choi | H01L 27/3211 257/40 |
| 2014/0353598 A1* | 12/2014 | Jeong | H01L 51/0002 257/40 |
| 2014/0361260 A1* | 12/2014 | Kim | H01L 27/3246 257/40 |
| 2015/0053948 A1* | 2/2015 | Matsushima | H01L 27/3218 257/40 |
| 2015/0340414 A1* | 11/2015 | Choi | H01L 27/3246 257/40 |

* cited by examiner

FOREIGN PATENT DOCUMENTS

| | | |
|---|---|---|
| JP | 2009-87760 A | 4/2009 |
| KR | 10-2007-0059877 A | 6/2007 |
| KR | 10-2013-0032248 A | 4/2013 |
| WO | 2011/139771 A3 | 11/2011 |
| WO | 2012/148884 A2 | 11/2012 |

*Primary Examiner* — Evren Seven
(74) *Attorney, Agent, or Firm* — Robert E. Bushnell, Esq.

(57) ABSTRACT

Provided is a method of manufacturing an organic light-emitting display apparatus. The method includes: forming a passivation layer on a substrate, on which pixel electrodes are formed, to cover the pixel electrodes; forming a first exposure portion in the passivation layer to expose a first pixel electrode among the pixel electrodes; forming a first intermediate layer on the exposed first pixel electrode; filling the first exposure portion with the same material as the passivation layer; forming a second exposure portion in the passivation layer to expose a second pixel electrode among the pixel electrodes; forming a second intermediate layer on the exposed second pixel electrode; filling the second exposure portion with the same material as the passivation layer; forming a third exposure portion in the passivation layer to expose a third pixel electrode among the pixel electrodes; and forming a third intermediate layer on the exposed third pixel electrode.

12 Claims, 13 Drawing Sheets

METHOD OF MANUFACTURING ORGANIC LIGHT-EMITTING DISPLAY APPARATUS

CLAIM OF PRIORITY

This application makes reference to, incorporates the same herein, and claims all benefits accruing under 35 U.S.C. §119 from an application earlier filed in the Korean Intellectual Property Office on 6 Jan. 2015 and there duly assigned Serial No. 10-2015-0001180.

BACKGROUND OF THE INVENTION

Field of the Invention

One or more exemplary embodiments of the present invention relate to methods of manufacturing organic light-emitting display apparatuses, and more particularly, to methods of manufacturing organic light-emitting display apparatuses improving the reliability of the organic light-emitting display apparatuses.

Description of the Related Art

Since an organic light-emitting display apparatus is a self-luminous display apparatus, a separate light source is unnecessary. Therefore, the organic light-emitting display apparatus may be driven at a low voltage and be manufactured to have a light weight and a slim profile. In addition, the organic light-emitting display apparatus has high-grade characteristics, such as wide viewing angle, high contrast, and fast response time. Therefore, the organic light-emitting display apparatus is considered as a next-generation display apparatus.

SUMMARY OF THE INVENTION

One or more exemplary embodiments include methods of manufacturing organic light-emitting display apparatuses.

Additional aspects will be set forth in part in the description which follows and, in part, will be apparent from the description, or may be learned by practice of the presented exemplary embodiments.

According to one or more exemplary embodiments, a method of manufacturing an organic light-emitting display apparatus includes steps of: forming a passivation layer on a substrate, on which a plurality of pixel electrodes are formed, to cover the pixel electrodes; forming a first exposure portion in the passivation layer to expose a first pixel electrode among the pixel electrodes; forming a first intermediate layer on the exposed first pixel electrode; filling the first exposure portion with the same material as the passivation layer; forming a second exposure portion in the passivation layer to expose a second pixel electrode among the pixel electrodes; forming a second intermediate layer on the exposed second pixel electrode; filling the second exposure portion with the same material as the passivation layer; forming a third exposure portion in the passivation layer to expose a third pixel electrode among the pixel electrodes; and forming a third intermediate layer on the exposed third pixel electrode.

The forming of the first exposure portion may include: forming a first photoresist layer on the passivation layer; partially exposing and etching the first photoresist layer to form a first opening at a position corresponding to the first exposure portion; and etching the passivation layer through the first opening.

The method may further include removing the first photoresist layer after the forming of the first intermediate layer.

The first photoresist layer may be removed before or after the filling of the first exposure portion.

The forming of the second exposure portion may include: forming a second photoresist layer on the passivation layer; partially exposing and etching the second photoresist layer to form a second opening at a position corresponding to the second exposure portion; and etching the passivation layer through the second opening.

The method may further include removing the second photoresist layer after the forming of the second intermediate layer.

The second photoresist layer may be removed before or after the filling of the second exposure portion.

The forming of the third exposure portion may include: forming a third photoresist layer on the passivation layer; partially exposing and etching the third photoresist layer to form a third opening at a position corresponding to the third exposure portion; and etching the passivation layer through the third opening.

In the forming of the third intermediate layer, the third intermediate layer may be formed on the third photoresist layer.

The method may further include removing the passivation layer to expose the first intermediate layer, the second intermediate layer, and the third intermediate layer.

The third photoresist layer formed on the passivation layer may be removed together with the passivation layer.

The method may further include forming an opposite electrode on the first intermediate layer, the second intermediate layer, and the third intermediate layer.

The method may further include forming a thin film encapsulating layer on the opposite electrode.

The method may further include forming a plurality of thin film transistors connected electrically to the pixel electrodes on the substrate.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
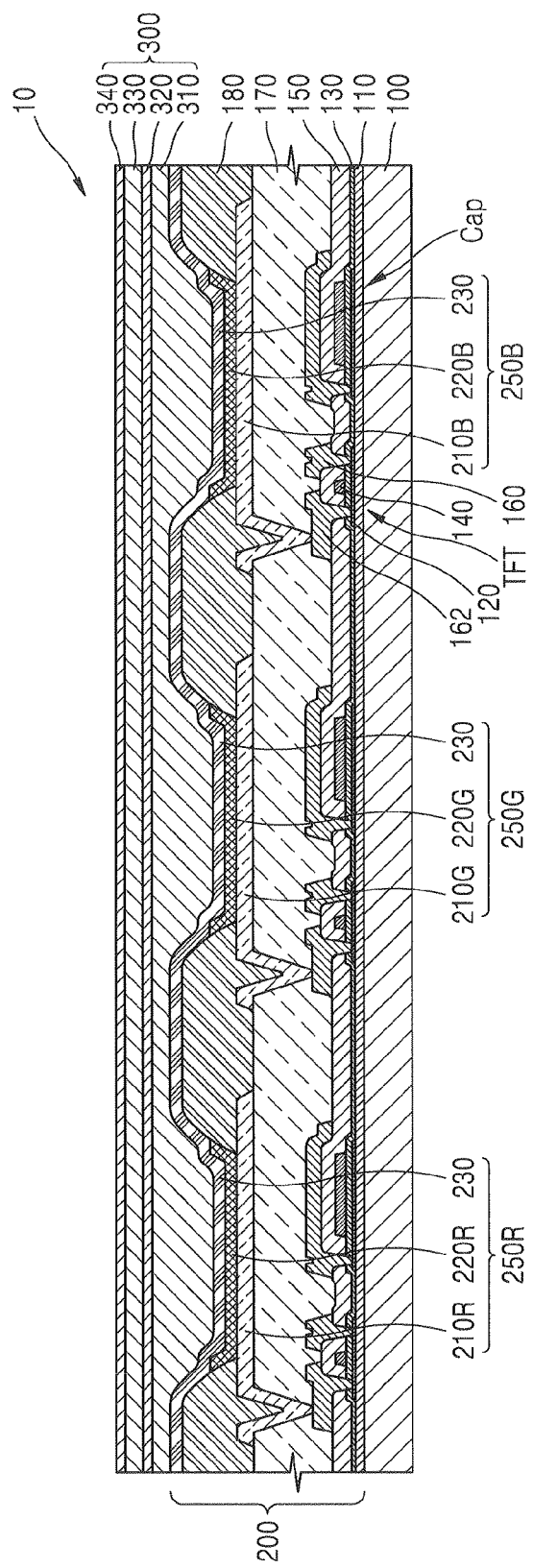
FIG. 1 is a cross-sectional view schematically illustrating an organic light-emitting display apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, expressions such as "at least one of," when preceding a list of elements, modify the entire list of elements and do not modify the individual elements of the list.

The inventive concept may include various embodiments and modifications, and exemplary embodiments thereof are illustrated in the drawings and will be described herein in detail. The effects and features of the inventive concept and the accomplishing methods thereof will become apparent from the following description of exemplary embodiments, taken in conjunction with the accompanying drawings. However, the inventive concept is not limited to the exemplary embodiments described below, and may be embodied in various modes.

It will be understood that although the terms "first", "second", etc. may be used herein to describe various components, these components should not be limited by these terms. These terms are only used to distinguish one component from another.

As used herein, the singular forms "a", "an" and "the" are intended to include the plural forms as well, unless the context clearly indicates otherwise.

It will be further understood that the terms "comprise", "include" and "have" used herein specify the presence of stated features or components, but do not preclude the presence or addition of one or more other features or components.

It will be understood that when a layer, region, or component is referred to as being "formed on" another layer, region, or component, it may be directly or indirectly formed on the other layer, region, or component. That is, for example, intervening layers, regions, or components may be present.

Sizes of elements in the drawings may be exaggerated for convenience of description. In other words, since sizes and thicknesses of elements in the drawings are arbitrarily illustrated for convenience of description, the following embodiments are not limited thereto.

When a certain embodiment may be implemented differently, a specific process order may be performed differently from the described order. For example, two consecutively described processes may be performed substantially at the same time or performed in an order opposite to the described order.

Hereinafter, exemplary embodiments will be described in detail with reference to the accompanying drawings. In the following description, like reference numerals denote like elements.

FIG. 1 is a cross-sectional view schematically illustrating an organic light-emitting display apparatus 10 according to an exemplary embodiment. FIGS. 2 to 10 are cross-sectional views schematically illustrating a method of manufacturing the organic light-emitting display apparatus 10 of FIG. 1 according to an exemplary embodiment.

Referring to FIGS. 1 to 10, the method of manufacturing the organic light-emitting display apparatus 10 according to an exemplary embodiment may include steps of: forming a passivation layer 410 on a substrate 100 on which a plurality of pixel electrodes 210R, 210G, and 210B are formed; forming a first exposure portion 412 in the passivation layer 410 to expose a first pixel electrode 210R; forming a first intermediate layer 220R on the exposed first pixel electrode 210R; filling the first exposure portion 412 with the same material as the passivation layer 410; forming a second exposure portion 414 in the passivation layer 410 to expose a second pixel electrode 210G; forming a second intermediate layer 220G on the exposed second pixel electrode 210G; filling the second exposure portion 414 with the same material as the passivation layer 410; forming a third exposure portion 416 in the passivation layer 410 to expose a third pixel electrode 210B; and forming a third intermediate layer 220B on the exposed third pixel electrode 210B.

Also, after the forming of the third intermediate layer 220B, the passivation layer 410 may be removed, and an opposite electrode 230 may be formed on the first intermediate layer 220R, the second intermediate layer 220G, and the third intermediate layer 220B that are exposed.

The pixel electrodes 210R, 210G, and 210B may be electrically connected respectively to a plurality of thin film transistors TFT formed on the substrate 100, and capacitors Cap may be formed on the substrate 100 together with the thin film transistors TFT. Each of the thin film transistors TFT may include an active layer 120, a gate electrode 140, a source electrode 160, and a drain electrode 162.

Hereinafter, a method of forming the thin film transistors TFT and the pixel electrodes 210R, 210G, and 210B connected electrically to the thin film transistors TFT on the substrate 100 will be first described.

The substrate 100 may be formed of a transparent glass substrate formed mainly of $SiO_2$. However, the substrate 100 is not limited thereto, and may also be formed of a transparent plastic material. The transparent plastic material of the substrate 100 may be an insulating organic material that is selected from the group consisting of polyether sulfone (PES), polyacrylate (PAR), polyetherimide (PEI), polyethylene naphthalate (PEN), polyethylene terephthalate (PET), polyphenylene sulfide (PPS), polyallylate, polyimide, polycarbonate (PC), cellulose triacetate (TAC), and cellulose acetate propionate (CAP).

When the organic light-emitting display apparatus 10 is a bottom emission type display apparatus that displays an image in the direction of the substrate 100, the substrate 100 may need to be formed of a transparent material. However, when the organic light-emitting display apparatus 10 is a top emission type display apparatus that displays an image in the opposite direction of the substrate 100, the substrate 100 may not need to be formed of a transparent material. In this case, the substrate 100 may be formed of a metal. When the substrate 100 is formed of a metal, the substrate 100 may include at least one selected from the group consisting of carbon (C), iron (Fe), chromium (Cr), manganese (Mn), nickel (Ni), titanium (Ti), molybdenum (Mo), and stainless steel (SUS), but is not limited thereto.

A buffer layer 110 may be formed on the substrate 100 to prevent impurities from penetrating into the active layer 120 of the thin film transistor TFT. The buffer film 110 may be formed of an inorganic material, such as silicon oxide, silicon nitride, silicon oxynitride, aluminum oxide, aluminum nitride, titanium oxide, or titanium nitride, an organic material, such as polyimide, polyester, or acryl, or a stack thereof.

The buffer layer 110 may be deposited by various deposition methods, such as plasma-enhanced chemical vapor deposition (PECVD), atmospheric pressure CVD (APCVD), and low pressure CVD (LPCVD).

The active layer 120 may be formed on the buffer layer 110. The active layer 120 may be formed of an inorganic semiconductor such as silicon, an organic semiconductor, or an oxide semiconductor material. The active layer 120 includes a source region, a drain region, and a channel region therebetween. For example, when the active layer 120 is formed of amorphous silicon, the active layer 120 including a source region, a drain region, and a channel region therebetween may be formed by forming an amorphous silicon layer on a front surface of the substrate 100, crystallizing the amorphous silicon layer to form a polycrystalline silicon layer, patterning the polycrystalline silicon layer, and doping a source region and a drain region at an edge thereof.

A gate insulating layer 130 is formed on the active layer 120. The gate insulating film 130 may be formed of a material such as $SiN_x$ or $SiO_2$ to insulate the active layer 120 from the gate electrode 140.

The gate electrode 140 may be formed on the active layer 120 with the gate insulating layer 130 interposed therebetween. The gate electrode 140 may be formed to have a single-layer structure or a multi-layer structure including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

An interlayer insulating layer 150 may be formed on the gate electrode 140. The interlayer insulating layer 150 may be formed to have a single-layer structure or a multi-layer structure including a material such as silicon oxide or silicon nitride.

The source electrode 160 and the drain electrode 162 are formed on the interlayer insulating layer 150. In detail, the interlayer insulating layer 150 and the gate insulating layer 130 are formed to expose the source region and the drain region of the active layer 120, and the source electrode 160 and the drain electrode 162 are formed to contact the exposed source region and drain region of the active layer 120.

The source electrode 160 and the drain electrode 162 may be formed to have a single-layer structure or a multilayer structure including at least one of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu).

FIG. 1 illustrates a top gate type TFT including the active layer 120, the gate electrode 140, and the source electrode 160, and the drain electrode 162 sequentially. However, exemplary embodiments are not limited thereto, and the gate electrode 140 may be disposed under the active layer 120.

A first insulating layer 170 may be formed on the source electrode 160 and the drain electrode 162. When an organic light-emitting device is disposed on the thin film transistor TFT, the first insulating layer 170 planarizes the top surface of the thin film transistor TFT and protects the thin film transistor TFT and various devices. The first insulating layer 170 may include $SiO_2$, $SiN_x$, SiON, $Al_2O_3$, $TiO_2$, $Ta_2O_5$, $HfO_2$, $ZrO_2$, barium strontium titanate (BST), or lead zirconate titanate (PZT). The organic insulating layer may include a general-purpose polymer, such as polymethylmethacrylate (PMMA) or polystyrene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. Also, the first insulating layer 170 may include a stack of an inorganic insulating layer and an organic insulating layer.

Organic light-emitting devices including a first sub-pixel 250R, a second sub-pixel 250G, and a third sub-pixel 250B may be formed on the first insulating layer 170. For example, the first sub-pixel 250R may be a red sub-pixel, the second sub-pixel 250G may be a green sub-pixel, and the third sub-pixel 250B may be a blue sub-pixel. The first sub-pixel 250R may include the first pixel electrode 210R, the first intermediate layer 220R, and the opposite electrode 230; the second sub-pixel 250G may include the second pixel electrode 210G, the second intermediate layer 220G, and the opposite electrode 230; and the third sub-pixel 250B may include the third pixel electrode 210B, the third intermediate layer 220B, and the opposite electrode 230.

In detail, the first to third pixel electrodes 210R, 210G, and 210B may be formed on the first insulating layer 170, may be connected respectively to the thin film transistors TFT through contact holes formed in the first insulating layer 170, and may be formed of transparent electrodes or reflective electrodes. When the first to third pixel electrodes 210R, 210G, and 210B are formed of transparent electrodes, they may be formed of ITO, IZO, ZnO, $In_2O_3$, IGO, or AZO. When the first to third pixel electrodes 210R, 210G, and 210B are formed of reflective electrodes, they may include a reflective layer formed of Ag, Mg, Al, Pt, Pd, Au, Ni, Nd, Ir, Cr, or any mixture thereof and a layer formed of ITO, IZO, ZnO, $In_2O_3$, IGO, or AZO. However, exemplary embodiments are not limited thereto, and the first to third pixel electrodes 210R, 210G, and 210B may be formed of various other materials and may be variously modified to have, for example, a single-layer structure or a multi-layer structure.

A second insulating layer 180 is formed on the first to third pixel electrodes 210R, 210G, and 210B. The second insulating layer 180 may be formed of at least one organic insulating material selected from the group consisting of polyimide, polyamide, acryl resin, benzocyclobutene, and phenol resin, by a method such as spin coating. The second insulating layer 180 may be a pixel definition layer exposing a predetermined region of the first to third pixel electrodes 210R, 210G, and 210B.

The first intermediate layer 220R, the second intermediate layer 220G, and the third intermediate layer 220B included respectively in the first sub-pixel 250R, the second sub-pixel 250G, and the third sub-pixel 250B may be formed in a pixel region defined by the second insulating layer 180; and the first intermediate layer 220R, the second intermediate layer 220G, and the third intermediate layer 220B may respectively include emission layers emitting red, green, and blue lights. In addition, the first intermediate layer 220R, the second intermediate layer 220G, and the third intermediate layer 220B may be formed of a stack of a hole injection layer (HIL), a hole transport layer (HTL), an electron transport layer (ETL), and an electron injection layer (EIL), and may have various structures.

Hereinafter, a method of forming the first intermediate layer 220R, the second intermediate layer 220G, and the third intermediate layer 220B on the substrate 100 on which the pixel electrodes 210R, 210G, and 210B are formed will be described in more detail.

Figure 2:
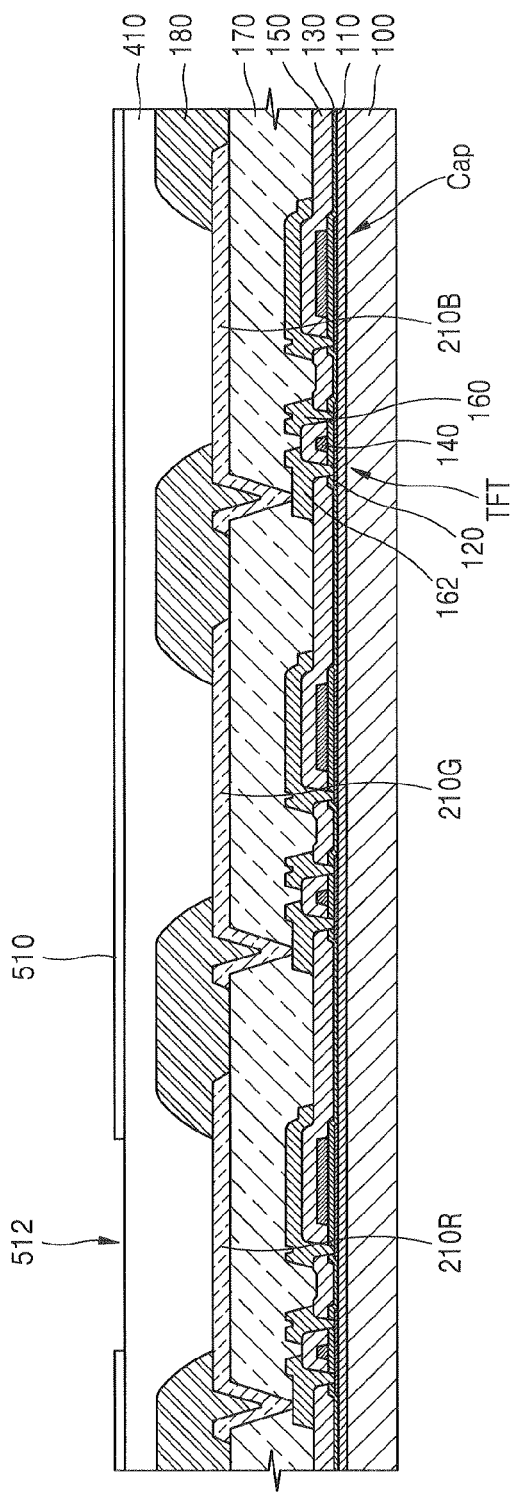
FIGS. 2 to 10 are cross-sectional views schematically illustrating a method of manufacturing the organic light-emitting display apparatus of FIG. 1 according to an exemplary embodiment.
Figure 3:
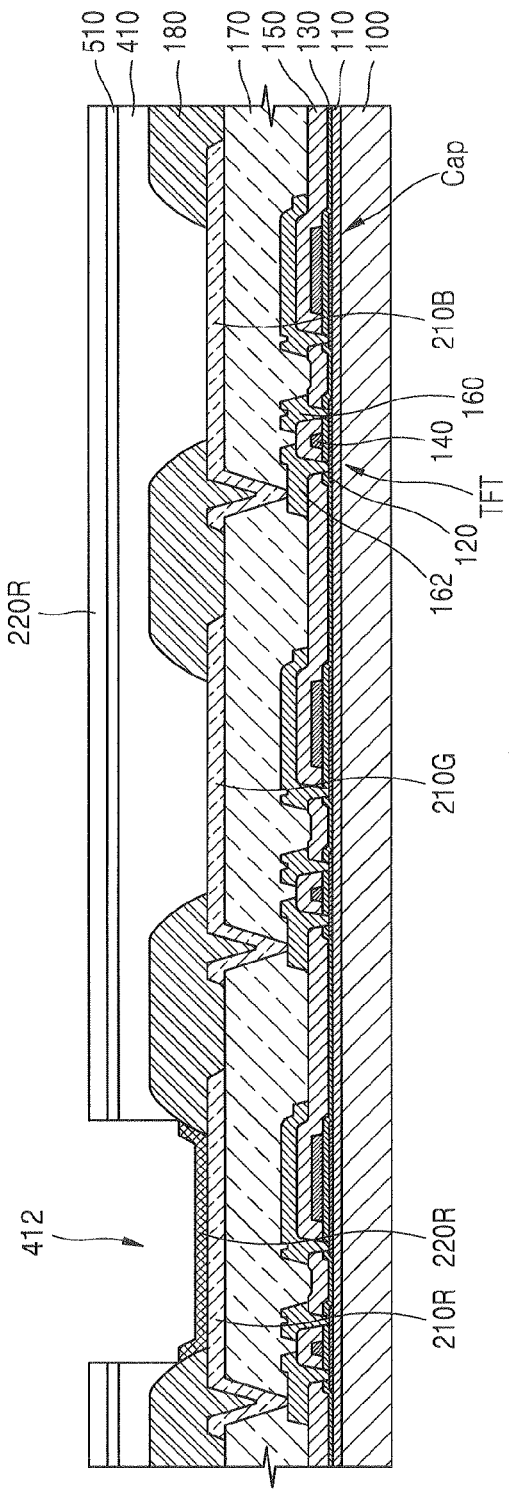

First, as illustrated in FIGS. 2 and 3, a passivation layer 410 is formed on the substrate 100 to cover the pixel electrodes 210R, 210G, and 210B; a first exposure portion 412 is formed in the passivation layer 410 to expose the first pixel electrode 210R; and a first intermediate layer 220R is formed on the exposed first pixel electrode 210R.

The passivation layer 410 is formed to correspond to the entire area of the substrate 100. Thus, the passivation layer 410 is formed to cover not only the pixel electrodes 210R, 210G, and 210B but also the second insulating layer 180. The passivation layer 410 does not react with an organic material, an organic solvent, or a water-soluble solvent, and is dissolved only in a dedicated stripper. For example, the passivation layer 410 may include fluoroether 75-95 wt % obtained by replacing some hydrogen of an ether structure with fluorine and a resin polymer 5-25 wt %.

The first exposure portion 412 may be formed by forming a first photoresist layer 510 on the passivation layer 410, partially exposing and etching the first photoresist layer 510 to form a first opening 512, and etching the passivation layer 410 through the first opening 512.

The first intermediate layer 220R is formed to correspond to the entire area of the substrate 100. Thus, the first intermediate layer 220R may be formed not only on the first pixel electrode 210R but also on the first photoresist layer 510.

Figure 4:
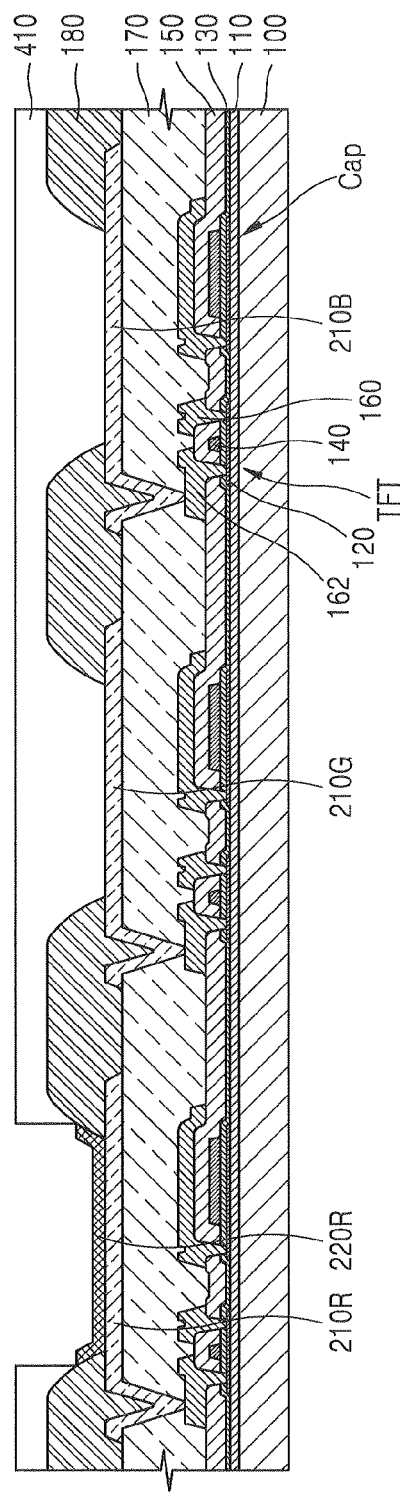
Figure 5:
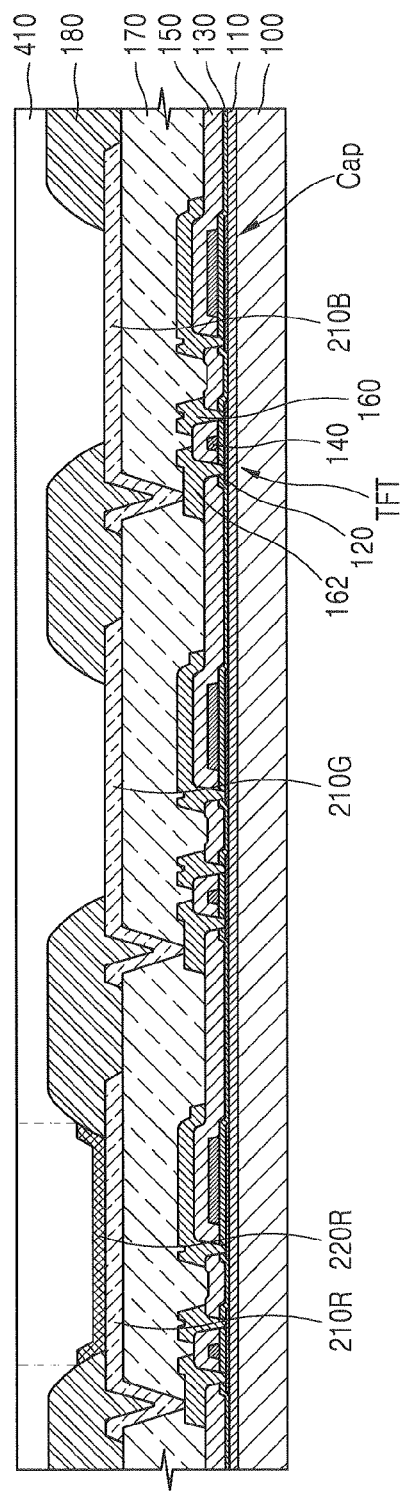

Thereafter, as illustrated in FIGS. 4 and 5, the first photoresist layer 510 and the first intermediate layer 220R disposed on the top of the first photoresist layer 510 is removed, and then the first exposure portion 412 is filled with the same material as the passivation layer 410.

The first photoresist layer 510 may be removed by a photoresist stripper that selectively removes only the first photoresist layer 510.

The first exposure portion 412 may be filled with the same material as the passivation layer 410, so that the passivation layer 410 may maintain the same state as that before the forming of the first exposure portion 412.

Figure 6:
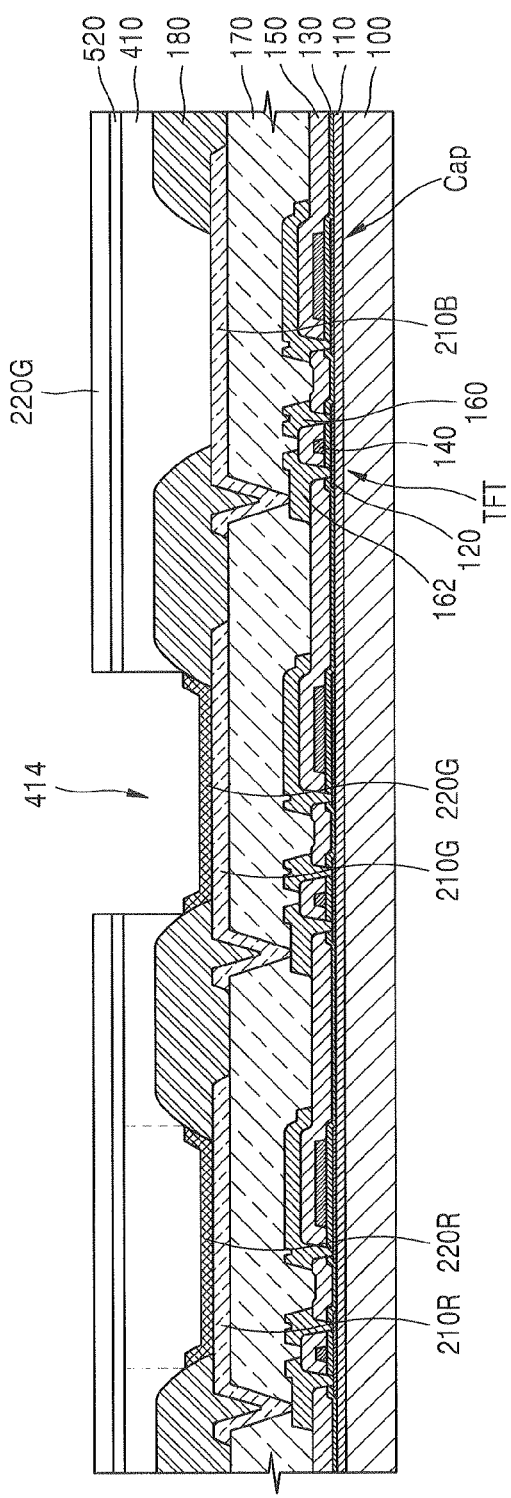

Subsequently, as illustrated in FIG. 6, a second exposure portion 414 is formed in the passivation layer 410 to expose the second pixel electrode 210G, and a second intermediate layer 220G is formed on the exposed second pixel electrode 210G.

The second exposure portion 414 may be formed in the same way as the first exposure portion 412. That is, the second exposure portion 414 may be formed by forming a second photoresist layer 520 on the passivation layer 410, patterning the second photoresist layer 520 through a photolithography process to form a second opening, and etching the passivation layer 410 through the second opening.

Since the second intermediate layer 220G is formed to correspond to the entire area of the substrate 100, the second intermediate layer 220G may also be formed on the second photoresist layer 520.

Figure 7:
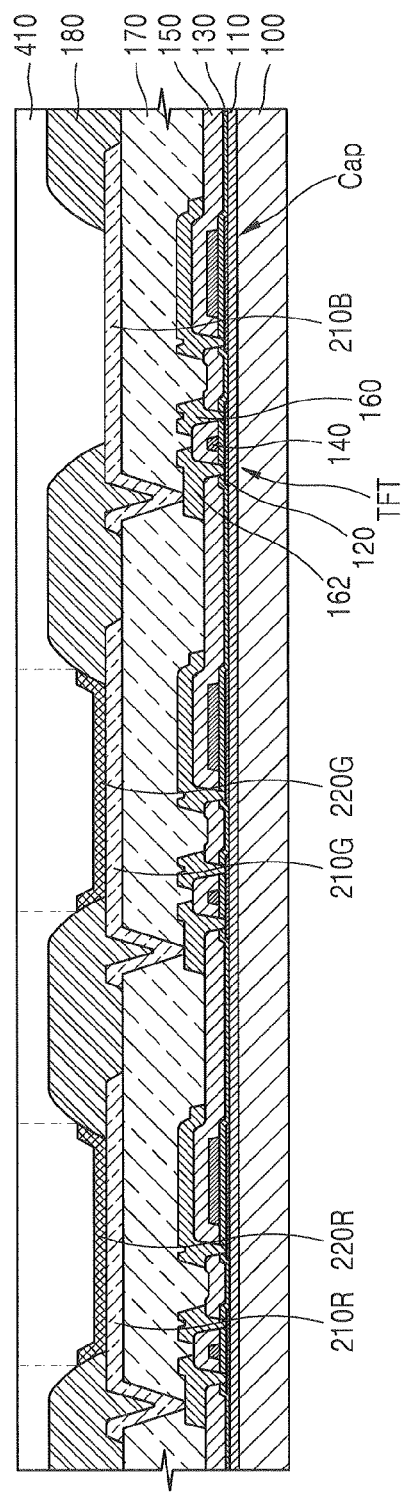

Subsequently, as illustrated in FIG. 7, the second photoresist layer 520 and the second intermediate layer 220G disposed on the top of the second photoresist layer 520 is removed, and the second exposure portion 414 is filled with the same material as the passivation layer 410.

The second photoresist layer 520 may be removed by a photoresist stripper that selectively removes only the second photoresist layer 520. The second exposure portion 414 may be filled with the same material as the passivation layer 410, so that the passivation layer 410 may maintain the same state as that before the forming of the first exposure portion 412 or the second exposure portion 414.

Figure 8:
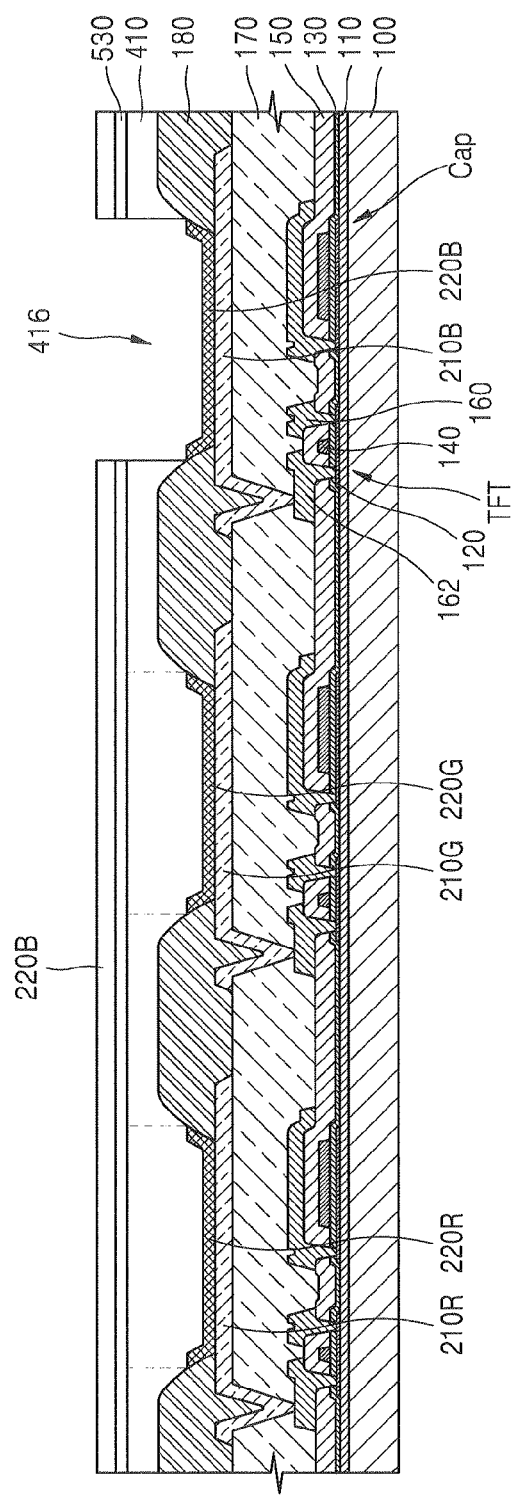

Thereafter, as illustrated in FIG. 8, a third exposure portion 416 is formed in the passivation layer 410 to expose the third pixel electrode 210B, and a third intermediate layer 220B is formed on the exposed third pixel electrode 210B.

The third exposure portion 416 may be formed in the same way as the first exposure portion 412 and the second exposure portion 414. That is, the third exposure portion 416 may be formed by forming a third photoresist layer 530 on the passivation layer 410, patterning the third photoresist layer 530 through a photolithography process to form a third opening, and etching the passivation layer 410 through the third opening.

Since the third intermediate layer 220B is formed to correspond to the entire area of the substrate 100, the third intermediate layer 220B may also be formed on the third photoresist layer 530.

Figure 9:
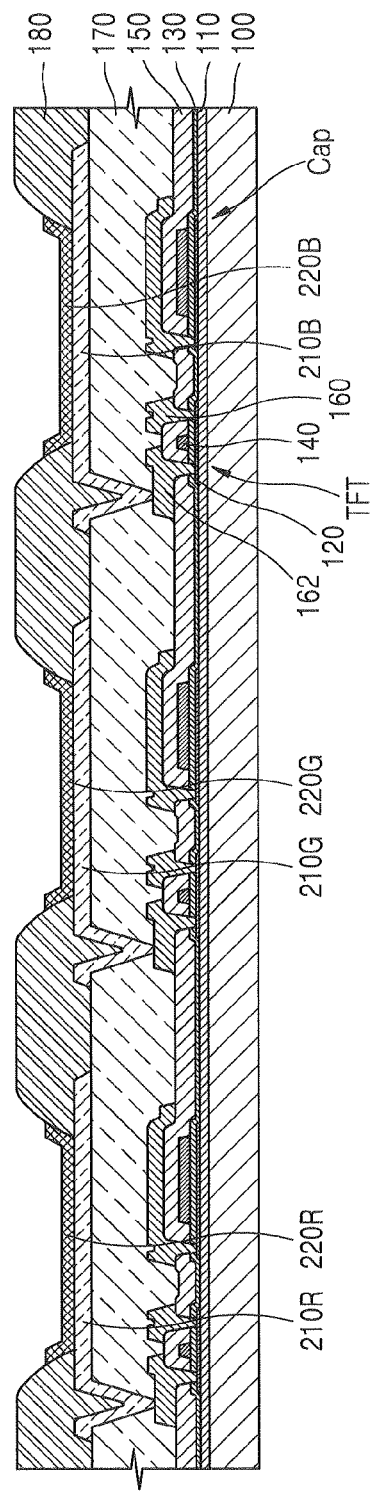
Figure 10:
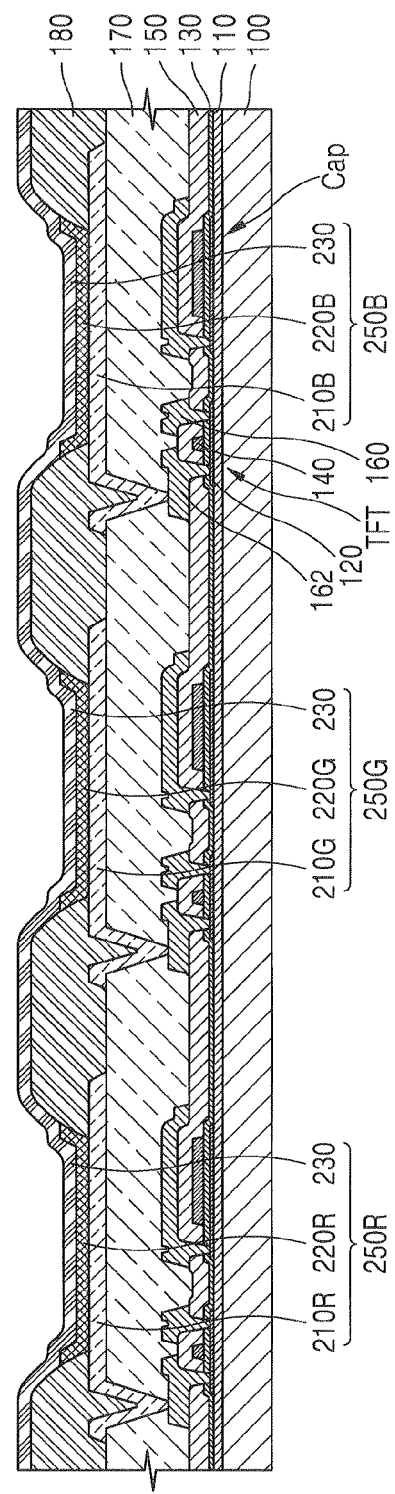

As illustrated in FIGS. 9 and 10, after the forming of the third intermediate layer 220B, the passivation layer 410 is removed to expose the first intermediate layer 220R, the second intermediate layer 220G, and the third intermediate layer 220B, and an opposite electrode 230 is formed on the first intermediate layer 220R, the second intermediate layer 220G, and the third intermediate layer 220B that are exposed. In this case, since the third photoresist layer 530 and the third intermediate layer 220B disposed on the top of the third photoresist layer 530 may be removed together with the passivation layer 410, it is not necessary to separately remove the third photoresist layer 530.

The passivation layer 410 may be removed by a stripper that may selectively remove only the passivation layer 410. For example, the passivation layer 410 may be removed by dipping the substrate 100 into a solution-type stripper including hydrofluoroether.

That is, according to the present exemplary embodiment, a process of removing the passivation layer 410 is included only once in the process of forming the first intermediate layer 220R, the second intermediate layer 220G, and the third intermediate layer 220B. Thus, in comparison with a method of removing the passivation layer 410 in each process of forming the first intermediate layer 220R, the second intermediate layer 220G, and the third intermediate layer 220B and newly forming the passivation layer 410, the period of time during which the first intermediate layer 220R, the second intermediate layer 220G, and the third intermediate layer 220B contact a solution for removing the passivation layer 410 may be reduced. Accordingly, the damage of the first intermediate layer 220R, the second intermediate layer 220G, and the third intermediate layer 220B may be prevented to improve the reliability of the organic light-emitting display apparatus 10.

The opposite electrode 230 may be formed over the entire surface of the substrate 100. The opposite electrode 230 may be formed of a transparent electrode or a reflective electrode.

When the opposite electrode 230 is formed of a transparent electrode, the opposite electrode 230 may include a layer formed of metal having a low work function, such as Li, Ca, LiF/Ca, LiF/Al, Al, Ag, Mg, or any mixture thereof, and a transparent conductive layer formed of ITO, IZO, ZnO, or $In_2O_3$. When the opposite electrode 230 is formed of a reflective electrode, the opposite electrode 230 may include a layer formed of Li, Ca, LiF/Ca, LiF/Al, Al, Ag, Mg, or any mixture thereof. However, the structure and material of the opposite electrode 230 are not limited thereto and may be variously modified.

Referring to FIG. 1, a thin film encapsulating layer 300 may be formed on the opposite electrode 230 to seal a display layer 200 and prevent external oxygen or moisture from penetrating into the display layer 200.

The thin film encapsulating layer 300 may include a plurality of organic layers 310 and 330 and a plurality of inorganic layers 320 and 340. For example, the organic layers 310 and 330 and the inorganic layers 320 and 340 may be alternately stacked to form a multi-layer structure.

The organic layers 310 and 330 may include, for example, at least one material selected from the group consisting of acryl-based resin, methacryl-based resin, polyisoprene-based resin, vinyl-based resin, epoxy-based resin, urethane-based resin, cellulose-based resin, and parylene-based resin.

The inorganic layers 320 and 340 may include, for example, at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

Although FIG. 1 illustrates an example in which the thin film encapsulating layer 300 is formed on the opposite electrode 230, exemplary embodiments are not limited thereto. That is, the organic light-emitting display apparatus 10 may include a sealing substrate (not illustrated) instead of the thin film encapsulating layer 300. The sealing substrate (not illustrated) may be attached to the substrate 100 by a sealing member and sealing glass frit to block external moisture or air.

Figure 11:
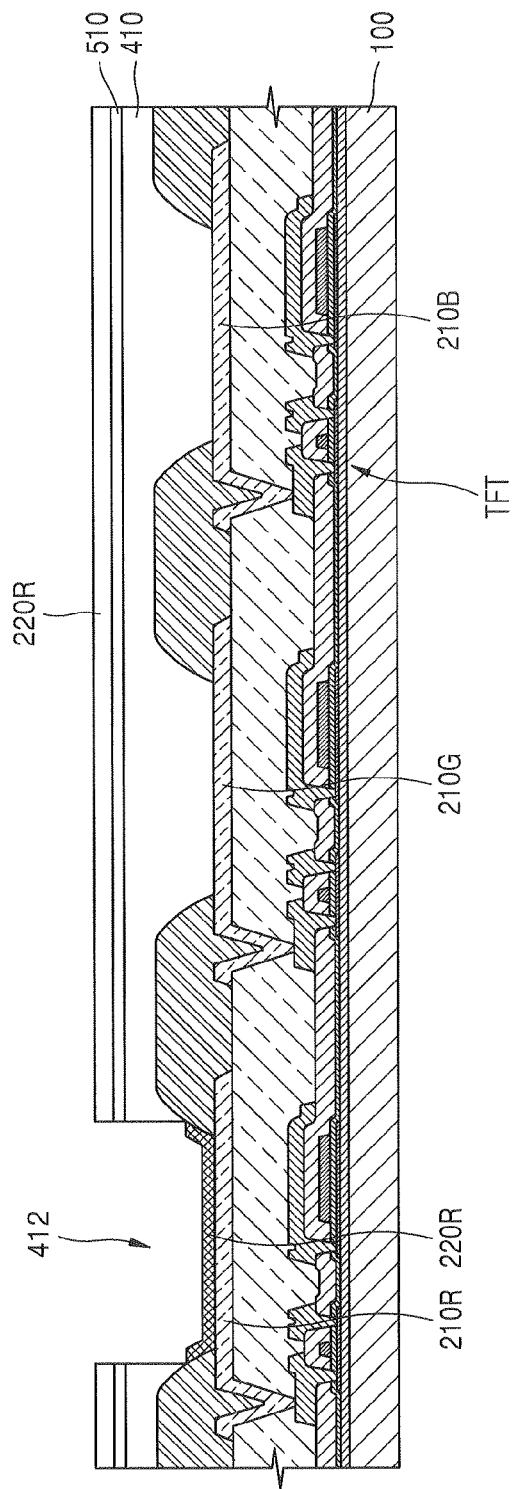
FIGS. 11 to 13 are cross-sectional views schematically illustrating a method of manufacturing the organic light-emitting display apparatus of FIG. 1 according to another exemplary embodiment.
Figure 12:
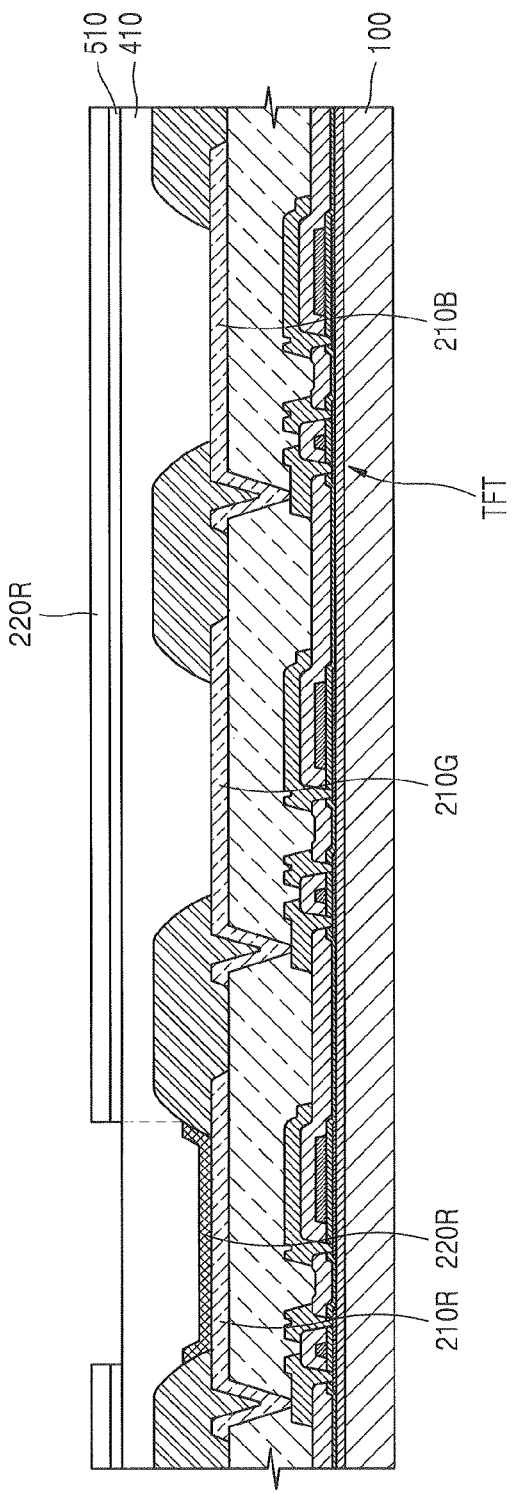
Figure 13:
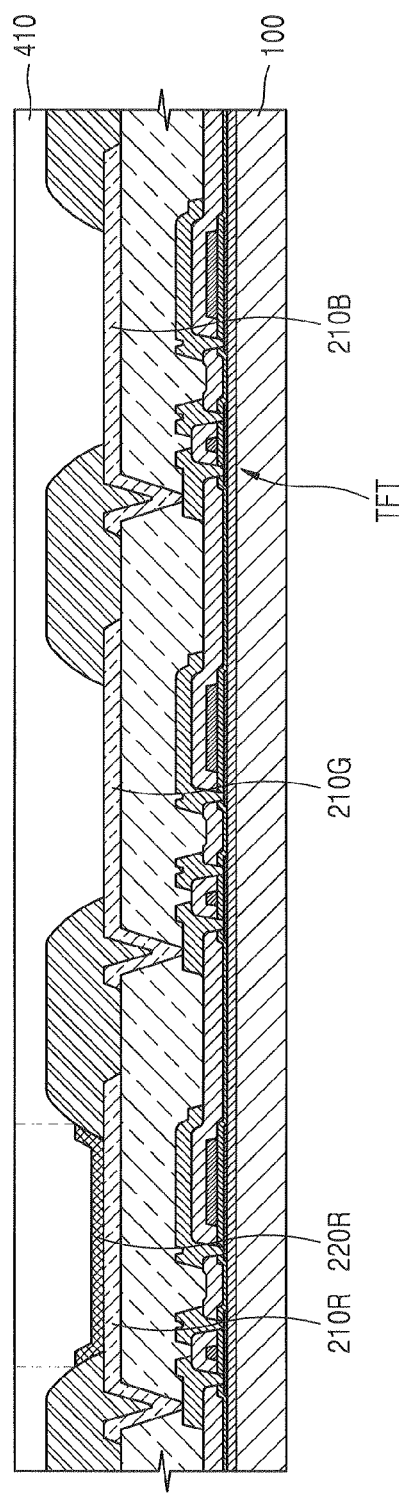

FIGS. 11 to 13 are cross-sectional views schematically illustrating a method of manufacturing the organic light-emitting display apparatus 10 of FIG. 1 according to another exemplary embodiment. The following descriptions will be made with reference to FIGS. 11 to 13 together with FIG. 1.

For convenience of description, FIGS. 11 to 13 illustrate only a process of forming the first intermediate layer 220R. FIG. 11 is in the same state as FIG. 3. That is, a passivation layer 410 is formed on the substrate 100 to cover the pixel electrodes 210R, 210G, and 210B; a first exposure portion 412 is formed in the passivation layer 410 to expose the first pixel electrode 210R; and a first intermediate layer 220R is formed on the exposed first pixel electrode 210R.

The first exposure portion 412 may be formed by forming a first photoresist layer 510 on the passivation layer 410, patterning the first photoresist layer 510 through a photolithography process, and etching the passivation layer 410 by using the patterned first photoresist layer 510.

Thereafter, as illustrated in FIGS. 12 and 13, the first exposure portion 412 is filled with the same material as the passivation layer 410, and then the first photoresist layer 510 is removed. That is, unlike the illustration of FIG. 4, the first exposure portion 412 is filled with the same material as the passivation layer 410 before the removing of the first photoresist layer 510. Thus, it is possible to prevent the first intermediate layer 220R from being affected by a photoresist stripper used to remove the first photoresist layer 510.

Likewise, a process of forming the second intermediate layer 220G includes filling a second exposure portion 414 (see FIG. 6) with the same material as the passivation layer 410 and then removing a second photoresist layer 520 (see FIG. 6). A process after the forming of the second intermediate layer 220G may be performed in the same way as illustrated in FIGS. 8 to 10.

Thus, according to the present exemplary embodiment, the influence of the photoresist stripper may be prevented in the process of forming the first intermediate layer 220R, the second intermediate layer 220G, and the third intermediate layer 220B. Also, since a process of removing the passivation layer 410 is included only once, the period of time during which the first intermediate layer 220R, the second intermediate layer 220G, and the third intermediate layer 220B contact the solution for removing the passivation layer 410 may be reduced. Therefore, the reliability of the organic light-emitting display apparatus 10 may be improved.

As described above, according to the one or more of the above exemplary embodiments, the reliability of the organic light-emitting display apparatus may be improved by preventing the damage of the intermediate layer including the emission layer in the process of manufacturing the organic light-emitting display apparatus.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the inventive concept as defined by the following claims.

What is claimed is:

1. A method of manufacturing an organic light-emitting display apparatus, the method comprising:
   forming first, second, and third pixel electrodes on a substrate,
   forming a passivation layer to cover the first, second, and third pixel electrodes;
   then forming a first exposure portion in the passivation layer to expose the first pixel electrode;
   forming a first intermediate layer on the exposed first pixel electrode;
   filling the first exposure portion with the same material as the passivation layer;
   then forming a second exposure portion in the passivation layer to expose the second pixel electrode;
   forming a second intermediate layer on the exposed second pixel electrode;
   filling the second exposure portion with the same material as the passivation layer;
   then forming a third exposure portion in the passivation layer to expose the third pixel electrode among the pixel electrodes; and
   forming a third intermediate layer on the exposed third pixel electrode;
   then removing the passivation layer to expose the first, second, and third intermediate layers;
   then forming an opposite electrode in contact with the first, second, and third intermediate layers.

2. The method of claim 1, wherein the forming of the first exposure portion comprises:
   forming a first photoresist layer on the passivation layer;
   partially exposing and etching the first photoresist layer to form a first opening at a position corresponding to the first exposure portion; and
   etching the passivation layer through the first opening.

3. The method of claim 2, further comprising removing the first photoresist layer after the forming of the first intermediate layer.

4. The method of claim 3, wherein the first photoresist layer is removed before or after the filling of the first exposure portion.

5. The method of claim 1, wherein the forming of the second exposure portion comprises:
   forming a second photoresist layer on the passivation layer;
   partially exposing and etching the second photoresist layer to form a second opening at a position corresponding to the second exposure portion; and
   etching the passivation layer through the second opening.

6. The method of claim 5, further comprising removing the second photoresist layer after the forming of the second intermediate layer.

7. The method of claim 6, wherein the second photoresist layer is removed before or after the filling of the second exposure portion.

8. The method of claim 1, wherein the forming of the third exposure portion comprises:
    forming a third photoresist layer on the passivation layer;
    partially exposing and etching the third photoresist layer to form a third opening at a position corresponding to the third exposure portion; and
    etching the passivation layer through the third opening.

9. The method of claim 8, wherein the third intermediate layer is formed on the third photoresist layer.

10. The method of claim 9, wherein the third photoresist layer formed on the passivation layer is removed together with the passivation layer.

11. The method of claim 1, further comprising forming a thin film encapsulating layer on the opposite electrode.

12. The method of claim 1, further comprising forming a plurality of thin film transistors connected electrically to the first, second, and third pixel electrodes on the substrate.

\* \* \* \* \*